(12) United States Patent
Atallah et al.

(10) Patent No.: US 9,251,875 B1
(45) Date of Patent: Feb. 2, 2016

(54) REGISTER FILE CIRCUIT AND METHOD FOR IMPROVING THE MINIMUM OPERATING SUPPLY VOLTAGE

(71) Applicant: QUALCOMM Incorporated, San Diego, CA (US)

(72) Inventors: Francois Ibrahim Atallah, Raleigh, NC (US); Jihoon Jeong, Cary, NC (US); Keith Alan Bowman, Morrisville, NC (US); Amey Sudhir Kulkarni, Raleigh, NC (US); Jason Philip Martzloff, Chapel Hill, NC (US); Joshua Lance Puckett, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/499,052

(22) Filed: Sep. 26, 2014

(51) Int. Cl.
  *G11C 7/22* (2006.01)
  *G11C 7/12* (2006.01)
  *G11C 5/06* (2006.01)

(52) U.S. Cl.
  CPC .. *G11C 7/12* (2013.01); *G11C 5/06* (2013.01); *G11C 7/22* (2013.01)

(58) Field of Classification Search
  CPC ................................... G11C 7/22; G11C 5/06
  USPC ................................................ 365/72, 233.5
  See application file for complete search history.

(56) References Cited

U.S. PATENT DOCUMENTS

| | | | |
|---|---|---|---|
| 7,952,422 B2 * | 5/2011 | Chuang ................ | G11C 5/147 327/534 |
| 8,094,505 B2 | 1/2012 | Khellah et al. | |
| 8,320,203 B2 | 11/2012 | Hwang et al. | |
| 8,462,541 B2 | 6/2013 | De et al. | |
| 8,493,124 B2 | 7/2013 | Chern et al. | |
| 2007/0242498 A1* | 10/2007 | Chandrakasan ..... | G11C 11/412 365/154 |
| 2008/0012424 A1* | 1/2008 | Shin et al. ............. | G11C 5/063 307/28 |
| 2008/0099805 A1* | 5/2008 | Abadeer ................ | H04N 5/374 257/292 |
| 2008/0123458 A1* | 5/2008 | Cheng .................. | G11C 11/413 365/227 |
| 2008/0273402 A1* | 11/2008 | Christensen ......... | G11C 7/1045 365/190 |
| 2011/0211383 A1* | 9/2011 | Russell ..................... | G11C 7/02 365/148 |
| 2011/0225438 A1* | 9/2011 | Joshi ..................... | G11C 11/417 713/320 |

(Continued)

OTHER PUBLICATIONS

Karl E., et al., "A 4.6GHz 162Mb SRAM Design in 22nm Tri-Gate CMOS Technology with Integrated Active VMINEnhancing Assist Circuitry", IEEE ISSCC, Session 13/High-Performance Embedded SRAM/13.1, 2012, pp. 230-232.

(Continued)

*Primary Examiner* — Michael Tran
(74) *Attorney, Agent, or Firm* — Muncy, Geissler, Olds & Lowe, P.C.

(57) ABSTRACT

A register file circuit according to some examples of the disclosure may include a memory cell, a header transistor circuit, and a driver circuit. The header transistor circuit may include one or more PFET headers in series with the PFETs of the memory cell with the gate of the PFET header for the row being written being controlled with a pulse write signal from the driver circuit. In some examples of the disclosure, the header transistor circuit may include an NFET pull-down inserted between a virtual-vdd and ground to discharge the virtual-vdd node reducing the contention during a write operation and a clamping NFET in parallel with the PFET header to clamp the virtual-vdd node to slightly below the threshold voltage of the pull-up PFET in the memory cell to ensure the pull-up PFET is barely off and prevent the virtual-vdd node from discharging all the way to ground.

30 Claims, 6 Drawing Sheets

(56) References Cited

U.S. PATENT DOCUMENTS

| | | | |
|---|---|---|---|
| 2013/0188434 A1 | 7/2013 | Puckett et al. | |
| 2013/0257513 A1* | 10/2013 | Sanchez | H03F 3/45381 327/404 |
| 2014/0003132 A1 | 1/2014 | Kulkarni et al. | |
| 2014/0112429 A1* | 4/2014 | Bhatia | G11C 19/28 377/67 |
| 2015/0003173 A1* | 1/2015 | Joshi | G11C 11/419 365/189.11 |

OTHER PUBLICATIONS

Raychowdhury A., et al., "PVT-and-Aging Adaptive Wordline Boosting for 8T SRAM Power Reduction," 2010 IEEE Journal of Solid-State Circuits Conference Digest of Technical Papers (ISSCC), 2010, pp. 352-353.

Raychowdhury, A., et al., "Tunable Replica Bits for Dynamic Variation Tolerance in 8T SRAM Arrays," IEEE Journal of Solid-State Circuits, Apr. 2011, vol. 46, No. 4, pp. 797-805.

\* cited by examiner

US 9,251,875 B1

REGISTER FILE CIRCUIT AND METHOD FOR IMPROVING THE MINIMUM OPERATING SUPPLY VOLTAGE

FIELD OF DISCLOSURE

This disclosure relates generally to register file circuits, and more specifically, but not exclusively, to register file circuits for memory cells.

BACKGROUND

As processors become more complex, the energy used by the processor increases and the need to maximize the energy usage becomes more important. In order to maximize processor energy efficiency, processor designs reduce the supply voltage (VDD) for applications with low-performance requirements (scaling). For example, register file circuits require a minimum operating VDD (VMIN) to successfully perform a write operation. Since register file arrays are distributed across a processor, the register file circuits and the processor logic share the same VDD. For this reason, the register file VMIN for a write operation limits the overall processor VDD scaling and the potential energy benefits. As shown in FIG. 1, the register file VMIN results from a contention path between the NFET transfer device (N4) attempting to bring node "T" to ground and the PFET pull-up device (P1) attempting to hold node "T" to VDD. Because the other NFET transfer device (N3) passes a weak "1" (VDD−Vt), where Vt is the transistor threshold voltage, into the complimentary node "C" and to the gate of P1, the P1 device stays partially on and resists the N4 device in bringing node "T" to ground. This contention is exacerbated as VDD reduces, especially when the process skews toward slow NFET devices and fast PFET devices. Since designs need to operate across all process corners, this contention limits the VMIN of register file circuits and consequently limits the processor energy efficiency. From simulations of a conventional processor, the register file VMIN results in a loss of more than 26% in processor energy savings.

Accordingly, there are long-felt industry needs for methods that improve upon conventional methods including the improved methods and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for improving the minimum operating voltage needed for write operations of a memory cell, such as a register file bit cell.

In some examples of the disclosure, the system, apparatus, and method includes a memory cell coupled to a virtual supply voltage and a write word line; a first header PFET having a gate, a source, and a drain, wherein the header PFET source is coupled to a system supply voltage, the header PFET gate is coupled to a driver, and the header PFET drain is coupled to the virtual supply voltage; a first header NFET having a gate, a source, and a drain, wherein the first header NFET drain is coupled to the virtual supply voltage, the first header NFET gate is coupled to the driver, and the first header NFET source is coupled to a ground; and a second header NFET having a gate, a source and a drain, wherein the second header NFET drain is coupled to the system supply voltage, the second header NFET gate is coupled to the driver, and the second header NFET source is coupled to the virtual supply voltage.

Other features and advantages associated with the apparatus and methods disclosed herein will be apparent to those skilled in the art based on the accompanying drawings and detailed description.

BRIEF DESCRIPTION OF THE DRAWINGS

The accompanying drawings are presented to describe examples of the present teachings, and are not limiting. The accompanying drawings are presented to aid in the description of examples of the disclosure and are provided solely for illustration of the examples and not limitation thereof.

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
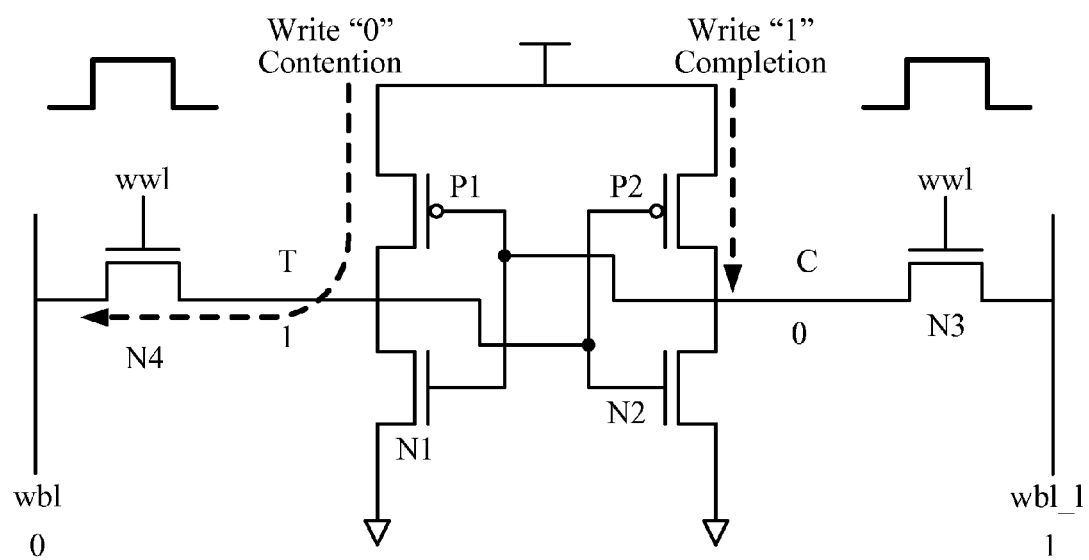
FIG. 1 illustrates a conventional register file bit cell.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Methods, apparatus, and systems for an improvement in the minimum operating voltage needed for write operations of a memory cell, such as a register file bit cell, are provided.

Some examples of the disclosure describes a register file circuit with a lower VMIN for writing the memory bit cell, thus resulting in a lower overall processor VMIN.

Some examples of the disclosure lower the write VMIN by removing or weakening the write contention in the memory cell by adding a header transistor circuit to quickly discharge or clamp a virtual vdd. The virtual vdd may be clamped low enough to write the memory cell without degrading the write completion. The header transistor circuit may include one or more PFET headers in series with the PFETs of the memory cells, thus creating a virtual VDD node. The gate of the PFET header for the row being written may be controlled with a pulse write signal, which may be generated by the assertion of the write clock. When write clock is activated, the PFET header shuts off the current path to the memory cell PFET contending during the write operation. In some examples of the disclosure, the PFET header may be provided locally for each bit cell. The header transistor circuit may include an NFET pull-down inserted between v_vdd and ground to discharge the virtual VDD node and reduce the contention during the write operation because v_vdd has a large capacitance which otherwise holds the voltage at v_vdd when the PFET header is off. The header transistor circuit may include a clamping NFET placed in parallel with the PFET header to clamp the virtual VDD node to slightly below the threshold voltage of the pull-up PFET in the memory cell to ensure the pull-up PFET is barely off and prevent the virtual VDD node from discharging all the way to ground.

In some examples of the disclosure, the header transistor circuit may include a programmable pulse generator that creates a range of possible pulse widths and locations relative to the write word line when the write clock is activated. The pulse generator may use configuration bits to control the width and the location of the pulse write signal enabling calibration of the optimum pulse width across process variations to minimize the register file VMIN per part or per processor bin.

In the description herein, the term "write" is used synonymously with "store" operations as is known in the art. Likewise, the term "read" is used synonymously with "load." Further, in the description, references may be made to read/write operations pertaining to "cache blocks," which may refer to a granularity less than that of an entire cache line. However, it will be understood that such references are merely for illustrative purposes and shall not be construed as limiting the scope of the disclosure. For example, disclosed techniques may be easily extended to operations on any other granularity as applicable, such as a cache word, cache line, etc. Further, it will also be understood that the referenced cache block may comprise data or instructions, even though the description may be provided in terms of write/read operations of data alone. Additionally, references to lower levels of memory hierarchy may include backing storage elements beyond local or first level (L1) caches which may be associated with processors or processing elements. For example, references to lower levels of memory hierarchy herein may refer to second level (L2) caches, main memory, and one or more levels of memory structures which may be present between L2 caches and main memory.

Various aspects are disclosed in the following description and related drawings to show specific examples relating to the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the examples described herein, the corresponding form of any such examples may be described herein as, for example, "logic configured to" perform the described action.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 2A:
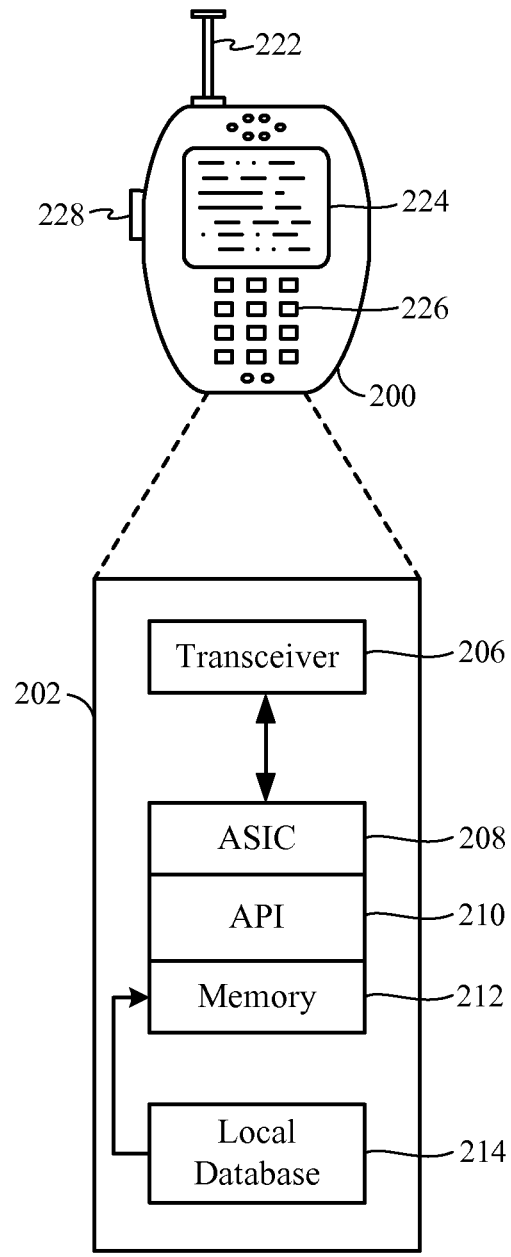
FIG. 2A illustrates an exemplary user equipment (UE) in accordance with some examples of the disclosure.

Referring to FIG. 2A, a system 100 that includes a UE 200, (here a wireless device), such as a cellular telephone, which has a platform 202 that can receive and execute software applications, data and/or commands transmitted from a radio access network (RAN) that may ultimately come from a core network, the Internet and/or other remote servers and networks. Platform 202 can include transceiver 206 operably coupled to an application specific integrated circuit ("ASIC" 208), or other processor, microprocessor, logic circuit, or other data processing device. ASIC 208 or other processor executes the application programming interface ("API") 210 layer that interfaces with any resident programs in memory 212 of the wireless device. Memory 212 can be comprised of read-only or random-access memory (RAM and ROM), EEPROM, flash cards, or any memory common to computer platforms. Platform 202 also can include local database 214 that can hold applications not actively used in memory 212. Local database 214 is typically a flash memory cell, but can be any secondary storage device as known in the art, such as magnetic media, EEPROM, optical media, tape, soft or hard disk, or the like. Internal platform 202 components can also be operably coupled to external devices such as antenna 222, display 224, push-to-talk button 228 and keypad 226 among other components, as is known in the art.

Accordingly, an example of the disclosure can include a UE including the ability to perform the functions described herein. As will be appreciated by those skilled in the art, the various logic elements can be embodied in discrete elements, software modules executed on a processor or any combination of software and hardware to achieve the functionality disclosed herein. For example, ASIC 208, memory 212, API 210 and local database 214 may all be used cooperatively to load, store and execute the various functions disclosed herein and thus the logic to perform these functions may be distributed over various elements. Alternatively, the functionality could be incorporated into one discrete component. Therefore, the features of UE 200 in FIG. 2A are to be considered merely illustrative and the disclosure is not limited to the illustrated features or arrangement.

The wireless communication between UE 200 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network. Accordingly, the illustrations provided herein are not intended to limit the examples of the disclosure and are merely to aid in the description of aspects of examples of the disclosure.

Figure 2B:
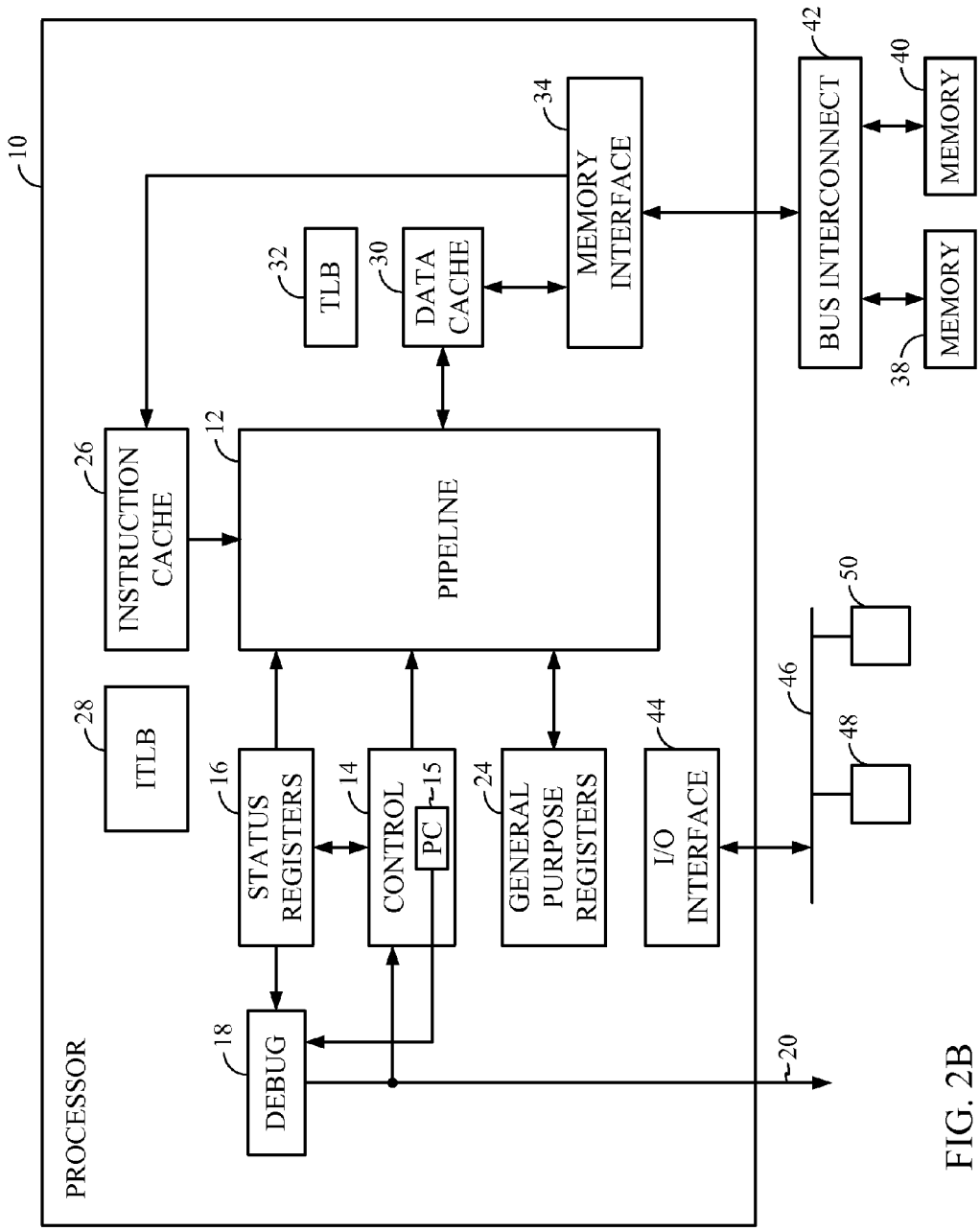
FIG. 2B illustrates an exemplary processor in accordance with some examples of the disclosure.

FIG. 2B depicts a functional block diagram of an exemplary processor 10, such as an ASIC 208 configured to incorporate features of the improved low voltage write speed to bitcell. Processor 10 executes instructions in an instruction execution pipeline 12 according to control logic 14. Control logic 14 maintains a Program Counter (PC) 15, and sets and clears bits in one or more status registers 16 to indicate, e.g., the current instruction set operating mode, information regarding the results of arithmetic operations and logical comparisons (zero, carry, equal, not equal), and the like. In some examples, pipeline 12 may be a superscalar design, with multiple, parallel pipelines. Pipeline 12 may also be referred to as an execution unit. A General Purpose Register (GPR) file 20 provides a list of general purpose registers 24 accessible by pipeline 12, and comprising the top of the memory hierarchy.

Processor 10, which executes instructions from at least two instruction sets in different instruction set operating modes, additionally includes a debug circuit 18, operative to compare, upon the execution of each instruction, at least a predetermined target instruction set operating mode to the current instruction set operating mode, and to provide an indication of a match between the two. Debug circuit 18 is described in greater detail below.

Pipeline 12 fetches instructions from an instruction cache (I-cache) 26, with memory address translation and permissions managed by an Instruction-side Translation Lookaside Buffer (ITLB) 28. Data is accessed from a data cache (D-cache) 30, with memory address translation and permissions managed by a main Translation Lookaside Buffer (TLB) 32. In various examples, ITLB 28 may comprise a copy of part of TLB 32. Alternatively, ITLB 28 and TLB 32 may be integrated. Similarly, in various examples of processor 10, I-cache 26 and D-cache 30 may be integrated, or unified. Further, I-cache 26 and D-cache 30 may be L1 caches. Misses in I-cache 26 and/or D-cache 30 cause an access to main (off-chip) memory 38, 40 by a memory interface 34. Memory interface 34 may be a master input to a bus interconnect 42 implementing a shared bus to one or more memory devices 38, 40 that may incorporate the improved low voltage write speed in accordance with some examples of the disclosure. Additional master devices (not shown) may additionally connect to bus interconnect 42.

Processor 10 may include input/output (I/O) interface 44, which may be a master device on a peripheral bus, across which I/O interface 44 may access various peripheral devices 48, 50 via bus 46. Those of skill in the art will recognize that numerous variations of processor 10 are possible. For example, processor 10 may include a second-level (L2) cache for either or both I and D caches 26, 30. In addition, one or more of the functional blocks depicted in processor 10 may be omitted from a particular example. Other functional blocks that may reside in processor 10, such as a JTAG controller, instruction pre-decoder, branch target address cache, and the like are not germane to a description of the present disclosure, and are omitted for clarity.

Figure 3:
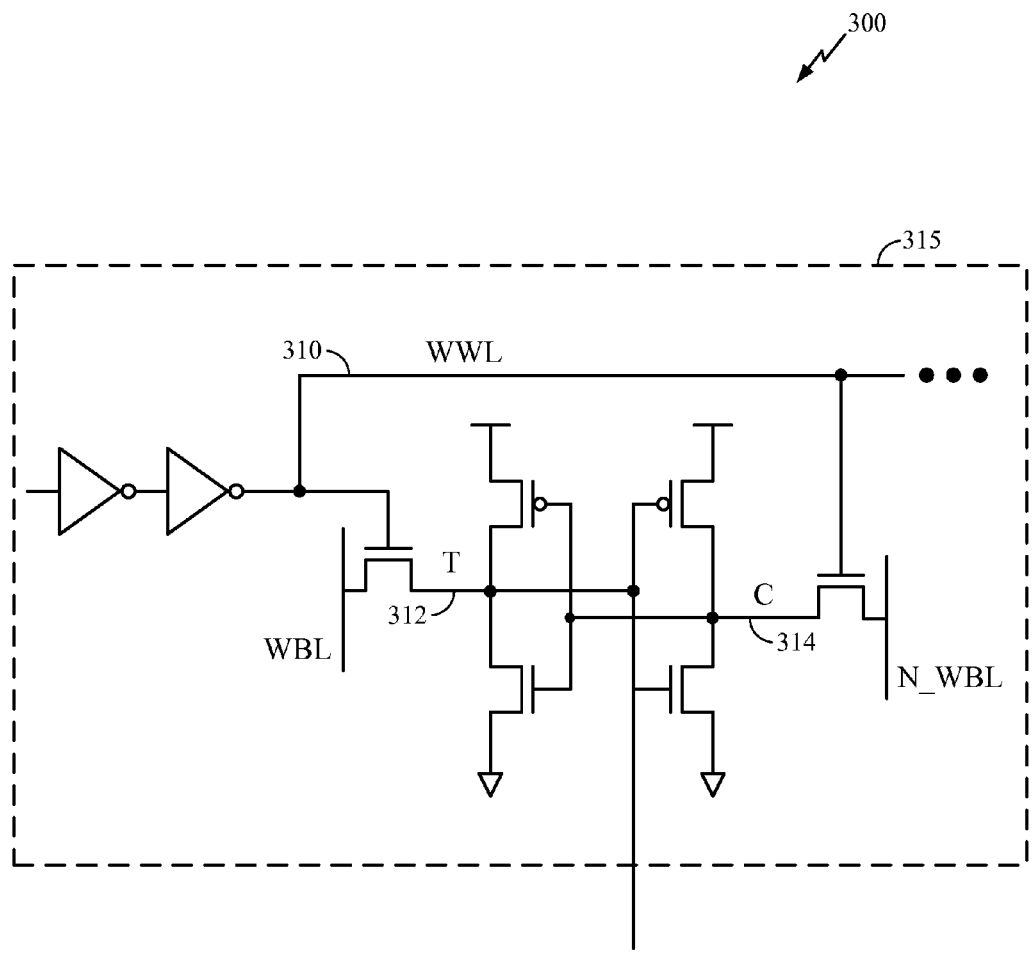
FIG. 3 illustrates an exemplary memory cell with write wordline (WWL) driver in accordance with some examples of the disclosure.

FIG. 3 depicts a memory cell or bitcell transistor circuit 300 with write wordline (WWL) drivers 310. A six transistor (6T) bitcell is a single-write port bitcell based on the six transistor (6T) bitcell that decouples write port 315 in order to eliminate read stability issues. This scheme enables the optimization of the 6T portion to perform writability and increase write speed in write port 315. Bitcells on a row share the same WWL and RWL and bitcells on the same column share read bitlines (RBL), word bitlines (WBL), complimentary word bitlines (N_WBL). True node 312 is a common true node selectively coupled through an n-type pass device (NFET) and a p-type pass device (PFET) in series, and complementary node 314 is a common complementary node selectively coupled through an NFET and a PFET in series therewith. The common true node is denoted as T and common complimentary node is denoted as C.

In low power CPUs, one of the common ways to reduce power is to reduce supply voltage (VDD). The supply voltage may be connected to a supply rail (not shown). As supply voltage is decreased, the decrease in performance is not linear, and it becomes exponential as the supply is reduced nearer to Vt of the highest-Vt devices which are typically found in memory arrays for leakage control reasons.

In the memory bitcell, these operating characteristics have ramifications for both data retention and write completion speed. As VDD approaches Vt, the hold-Signal Noise Margin (SNM), which is the data retention figure of merit for Static Random Access Memory (SRAM), is degraded because the voltage scale-down causes the leakage current of the NFET to become comparable to the saturation current of the PFET. Write speed, on the other hand, is dependent on 2 operations: writing a "0" phase, which is quickly pulling the T node or the C node to ground through one of the transfer NFET, and followed by the write completion phase which is quickly pulling the C node or T node to VDD by one of the pull-up PFET. This degradation adversely impacts the write completion because at low voltage, the PFETs have to pull up the input to HIGH as the NFETs only get a very weak HIGH. Since the ratio of NFETs/PFETs is usually 2-3×, the PFETs tend to be very weak and this speed will dictate the minimum write time at low voltage (the minimum time WWL 310 needs to be HIGH in order to write the cell); While this degradation weakens the pull-up PFET device, it is not enough to help with the first write operation. There is a contention path where the pull-up PFET is fighting the transfer NFET device to keep the T node or C node from being pulled to "0".

The most straightforward way to improve the data retention and write speed with regard to weak PFETs at low voltage is to upsize or use a lower Vt device. However, this is not an optimal solution, since it will make the cell's writability degrade at all voltages (more contention from the PFET means the NFET will have a harder time flipping the node) and this leads to increased leakage.

Figure 4:
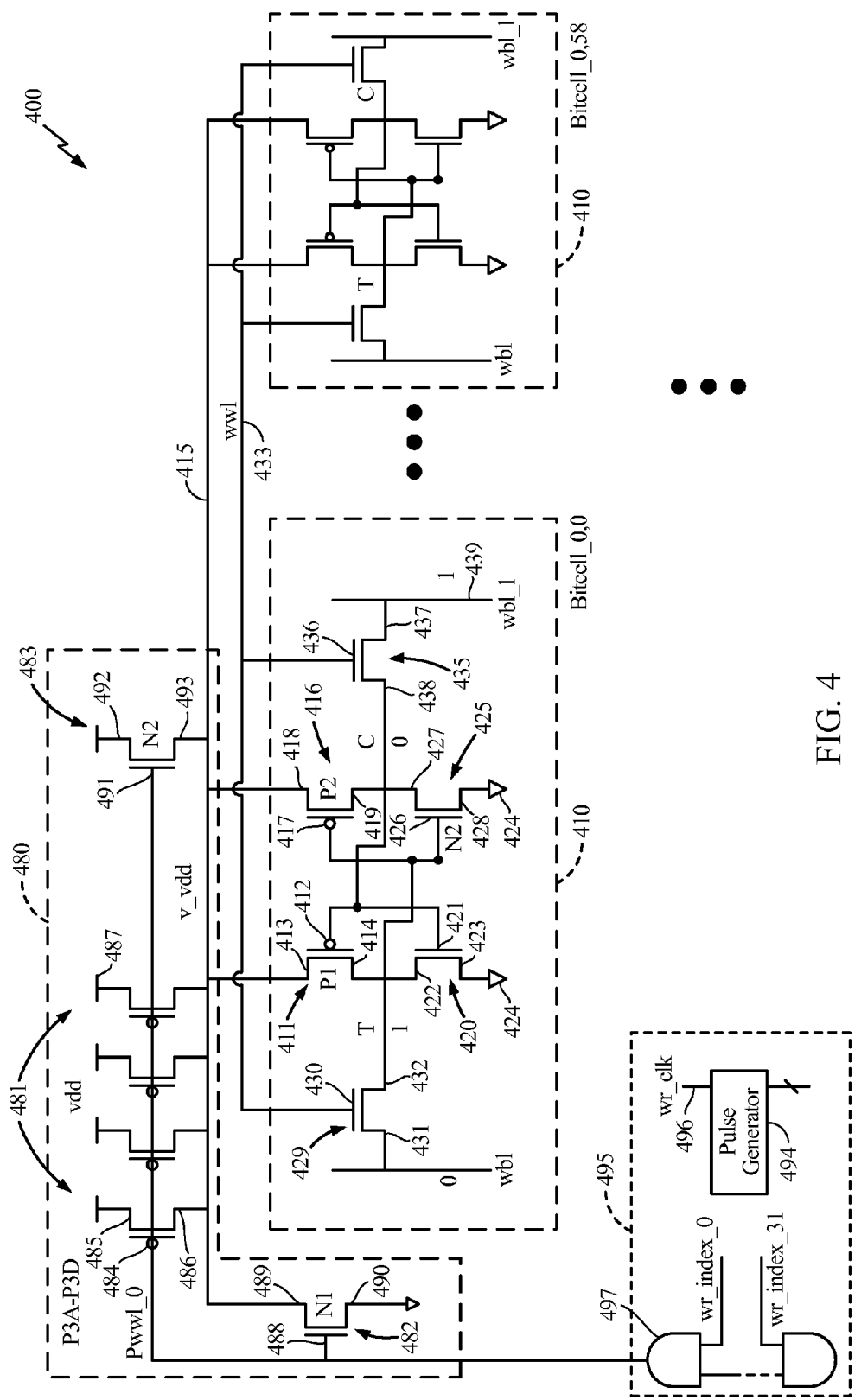
FIG. 4 illustrates an exemplary register file circuit with header transistors in accordance with some examples of the disclosure.

FIG. 4 depicts a register file circuit with in accordance with some examples of the disclosure. As shown in FIG. 4, a register file circuit 400 may include a plurality of memory or bitcells 410, a header circuit 480, and a driver circuit 495. While a plurality of memory cells 410 are shown, it should be understood that a single memory cell may be used. Additionally, the memory cells 410 may include a read circuit (not shown).

Each memory cell 410 may include a first PFET 411 having a gate 412, a source 413 and a drain 414. The first PFET source 413 may be coupled to a virtual supply voltage (v_vdd) 415. Each memory cell 410 may include a second PFET 416 having a gate 417, a source 418, and a drain 419. The second PFET source 418 may be coupled to the virtual supply voltage 415.

Each memory cell 410 may include a first NFET 420 having a gate 421, a source 422, and a drain 423. The first NFET source 422 may be coupled to the first PFET drain 414, the first NFET gate 421 may be coupled to the first PFET gate 412, and the first NFET drain 423 may be coupled to a ground 424. Each memory cell 410 may include a second NFET 425 having a gate 426, a source 427, and a drain 428. The second NFET source 427 may be coupled to the second PFET drain 419, the second NFET gate 426 may be coupled to the second PFET gate 417, and the second NFET drain 428 may be coupled to ground 424. While not shown, the second NFET gate may be coupled to a read circuit.

Each memory cell 410 may include a third NFET 429 having a gate 430, a source 431, and a drain 432. The third NFET gate 430 may be coupled to a write word line 433, the third NFET drain 432 may be coupled to the second PFET gate 417 and the second NFET gate 426, and the third NFET source 431 may be coupled to a write bit line (wbl) 434. Each memory cell 410 may include a fourth NFET 435 having a gate 436, a source 437, and a drain 438. The fourth NFET gate 436 may be coupled to the write word line 433, the fourth NFET drain 438 may be coupled to the first PFET gate 412 and the first NFET gate 421, and the fourth NFET source may be coupled to a word bit line complement (wbl_1) 439.

The header circuit 480 may include a plurality header PFETs 481, a first header NFET 482, and a second header NFET 483. While a plurality of header PFETs 481 are shown, it should be understood that a single header PFET 481 may be used. In addition, while a single header circuit 480 is shown for the plurality of memory cells 410, it should be understood that a separate header circuit 480 may be provided for each memory cell 410. When a separate header circuit 480 is provided by for each memory cell 410, a single common pair of header NFET devices 482 and 483 may be used instead of a pair of header NFET devices for each memory cell 410.

Each header PFET 481 may include a gate 484, a source 485, and a drain 486. The header PFET source 485 may be coupled to a system supply voltage (vdd) 487 that supplies voltage for the processor coupled to the memory cell, the header PFET gate 484 may be coupled to driver circuit 495, and the header PFET drain 486 may be coupled to the virtual supply voltage 415.

The first header NFET 482 may have a gate 488, a source 489, and a drain 490. The first header NFET source 489 may be coupled to the virtual supply voltage 415, the first header NFET gate 488 may be coupled to the driver circuit 495, and the first header NFET drain 490 may be coupled to ground 424.

The second header NFET 483 may have a gate 491, a source 493, and a drain 492. The second header NFET source 493 may be coupled to the system supply voltage 487, the second header NFET gate 491 may be coupled to the driver circuit 495, and the second header NFET drain 492 may be coupled to the virtual supply voltage 415.

The driver circuit 495 may include a pulse generator 494 coupled to a write clock signal (wr_clk) 496 and a write signal output 497 coupled to the gate or gates of each header PFET 481, the first header NFET 482, and the second header NFET 483.

An exemplary operation of the register file circuit 400 shown in FIG. 4 according to some examples of the disclosure will now be described. The header PFETs 481 are configured to lower the voltage of the virtual supply voltage 415 below a threshold voltage (Vt) of the memory cell PFETs 411 and 416. This may be accomplished by a write signal output turning off the header PFETs 481 while the first header NFET 482 is turned on when the gates of the header PFETs 481 and the first header NFET 482 are coupled to the write signal output generated by the driver circuit 495. This configuration will shut the current path to the memory cells 410, which turns off the first PFET 411 and the second PFET 416 and eliminates the write contention within the memory cells 410. To prevent the virtual supply voltage 415 going to ground or zero, the second header NFET 483 clamps the virtual supply voltage 415 to vdd minus Vt of PFETs 411 and 416. This may be accomplished by sizing NFETs 482 and 483 to provide a resistor divider ratio voltage desired.

The write signal output of the driver circuit 495 may include a pulse generator 494 that provides a pulse write signal of a width designed to prevent complete removal of the write contention during the entire period the write word line 433 is active. The width of the pulse may be configured and timed (location relative to the write word line signal) to quickly complete the write process while reducing the energy required by keeping the first header NFET 482 and the second header NFET 483 on at the same time. The width of the pulse write signal may also be optimized to address process variations that occur in the circuit during the manufacturing or fabrication process.

Figure 5:
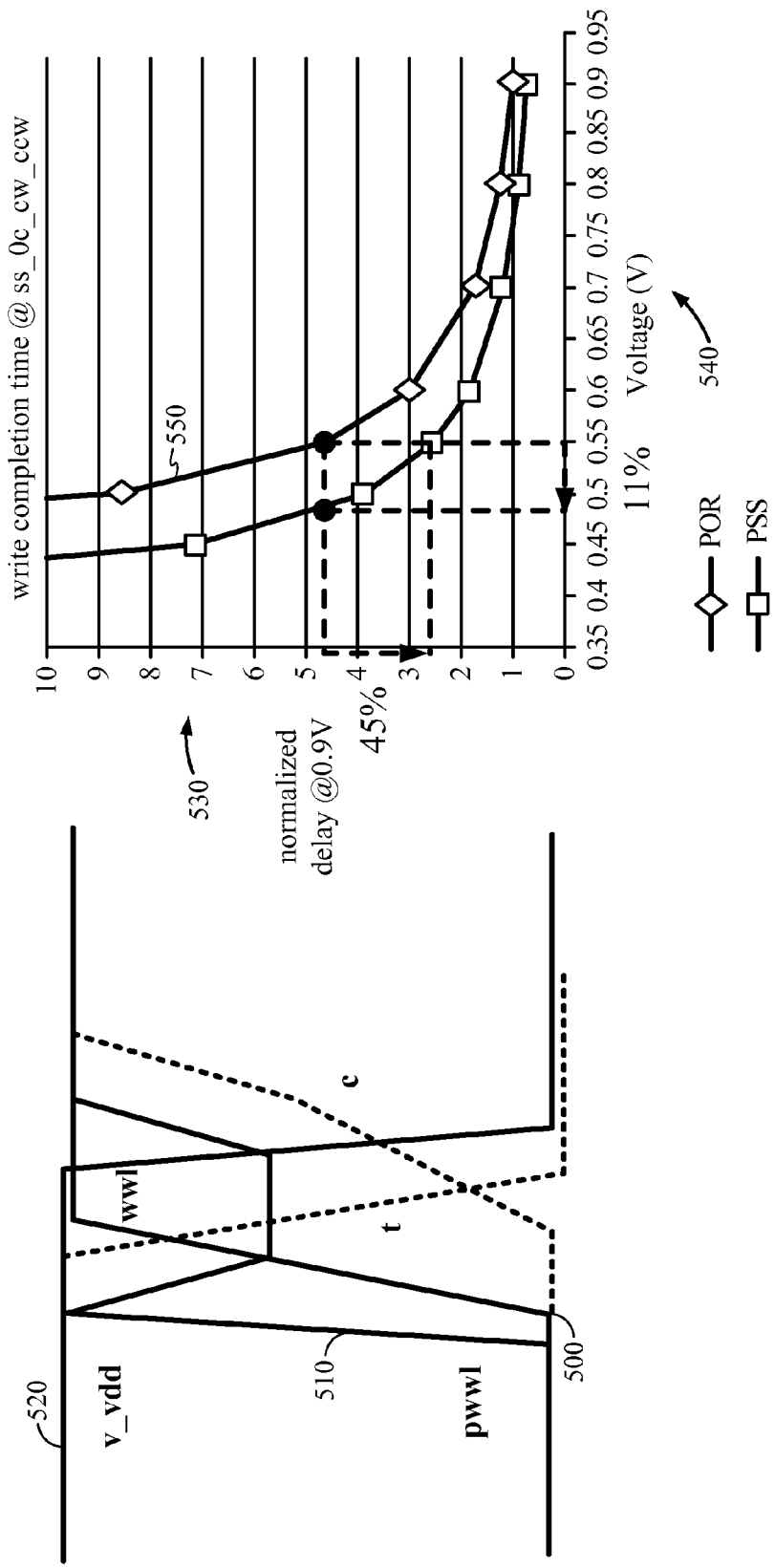
FIG. 5 illustrates exemplary timing diagrams and completion time graphs of the write process for a register file circuit in accordance with some examples of the disclosure.

FIG. 5 depicts timing diagrams and completion time graphs of the write process for a register file circuit in accordance with some examples of the disclosure. As shown in FIG. 5, the write word line signal 500 is activated and rises from zero to vdd. Prior to activation of the write word line signal 500, the pulse write signal 510 is output from the driver circuit raising the voltage on the pulse write signal line from zero to vdd. As the pulse write signal 510 reaches vdd, the virtual supply voltage signal 520 dips down below vdd and gets clamped at a voltage dependent upon the ratio of the first header NFET and the second header NFET before the write word line signal 500 reaches vdd. The width of the pulse write signal is configured to provide enough time for write completion before the pulse write signal voltage drops back to zero. As shown in FIG. 5, a y-axis 530 shows the normalized delay at 0.9 volts (normalized to a conventional bitcell that does not have any write assist mechanism) and a x-axis 540 shows the Vmin of a memory cell in volts. The graph of a write completion time for a conventional 6T bitcell 550 shows a Vmin of 0.55 volts while the graph of a write completion time for a register file circuit according to some examples of the disclosure 560 shows a Vmin of approximately 0.48 volts during the same delay. This results in an 11% reduction in Vmin, which translates to a 21% energy savings during a write completion. If the desired Vmin of the register file circuit with write assist according to some examples is 0.55 volts, the use of write assist will still result in a 45% reduction in the delay for write completion.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

The examples described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. A register file circuit comprising:
   a memory cell coupled to a virtual supply voltage and a write word line;
   a first header PFET having a gate, a source, and a drain, wherein the header PFET source is coupled to a system supply voltage, the header PFET gate is coupled to a driver circuit, and the header PFET drain is coupled to the virtual supply voltage;
   a first header NFET having a gate, a source, and a drain, wherein the first header NFET drain is coupled to the virtual supply voltage, the first header NFET gate is coupled to the driver circuit, and the first header NFET source is coupled to a ground; and
   a second header NFET having a gate, a source and a drain, wherein the second header NFET drain is coupled to the system supply voltage, the second header NFET gate is coupled to the driver circuit, and the second header NFET source is coupled to the virtual supply voltage.

2. The register file circuit of claim 1, wherein the first header NFET discharges the virtual supply voltage to the ground and the second header NFET clamps the virtual supply voltage to a write voltage, the write voltage equals a supply voltage minus a threshold voltage.

3. The register file circuit of claim 1, wherein the driver circuit comprises a pulse generator having a variable output pulse width.

4. The register file circuit of claim 3, wherein the driver circuit outputs a pulse write signal coupled to the first header NFET gate, the second header NFET gate, and the first header PFET gate.

5. The register file circuit of claim 4, wherein the driver circuit inputs a write clock signal and the pulse write signal is output before a write word line signal is active.

6. The register file circuit of claim 5, wherein the pulse write signal has a pulse width configured to provide a write completion time that allows the memory cell sufficient time to perform a write operation on the memory cell.

7. The register file circuit of claim 1, wherein the memory cell comprises:
   a first PFET having a gate, a source and a drain, wherein the first PFET source is coupled to the virtual supply voltage;
   a second PFET having a gate, a source, and a drain, wherein the second PFET source is coupled to the virtual supply voltage;
   a first NFET having a gate, a source and a drain, wherein the first NFET source is coupled to the first PFET drain and the first NFET gate is coupled to the first PFET gate;
   a second NFET having a gate, a source, and a drain, wherein the second NFET source is coupled to the second PFET drain and the second NFET gate is coupled to the second PFET gate;
   a third NFET having a gate, a source, and a drain, wherein the third NFET gate is coupled to the write word line and the third NFET drain is coupled to the second PFET gate and the second NFET gate; and
   a fourth NFET having a gate, a source, and a drain, wherein the fourth NFET gate is coupled to the write word line and the fourth NFET drain is coupled to the first PFET gate and the first NFET gate.

8. The register file circuit of claim 7, wherein the first header pFET is configured to turn ON when the first NFET and the second NFET are OFF, and turn OFF, when the first NFET and the second NFET are ON.

9. The register file circuit of claim 7, further comprising a first common node and a second common node, wherein the first common node comprises a true bitline and the second common node comprises a complementary bitline.

10. The register file circuit of claim 9, wherein the first common node is operatively configured to connect to the first NFET source and the second common node is configured to connect to the second NFET source.

11. The register file circuit of claim 10, wherein the first common node and the second common node are driven to complementary logic voltages when performing a write operation on the memory cell.

12. The register file circuit of claim 11, wherein the driver circuit outputs a pulse write signal and, when the pulse write signal is logic value HIGH, the first header PFET turns OFF and causes the first PFET and second PFET to turn OFF.

13. The register file circuit of claim 12, wherein the header pFET is configured to turn ON when the first NFET and the second NFET are OFF, and turn OFF when the first NFET and the second NFET are ON.

14. The register file circuit of claim 1, wherein the memory cell is integrated into one of a mobile phone, a mobile communication device, a pager, a personal digital assistant, a personal information manager, a mobile hand-held computer, a laptop computer, a wireless device, or a wireless modem.

15. A register file circuit comprising:
a plurality of memory cells, each of the plurality of memory cells coupled to a virtual supply voltage and a write word line;
a plurality of header PFETs, each of the plurality of header PFETs having a gate, a source, and a drain, wherein each header PFET source is coupled to a system supply voltage, each header PFET gate is coupled to a driver circuit, and each header PFET drain is coupled to the virtual supply voltage;
a first header NFET having a gate, a source, and a drain, wherein the first header NFET drain is coupled to the virtual supply voltage, the first header NFET gate is coupled to the driver circuit, and the first header NFET source is coupled to a ground; and
a second header NFET having a gate, a source and a drain, wherein the second header NFET drain is coupled to the system supply voltage, the second header NFET gate is coupled to the driver circuit, and the second header NFET source is coupled to the virtual supply voltage.

16. The register file circuit of claim 15, wherein the first header NFET discharges the virtual supply voltage to the ground and the second header NFET clamps the virtual supply voltage to a write voltage, the write voltage equals a supply voltage minus a threshold voltage.

17. The register file circuit of claim 15, wherein the driver circuit comprises a pulse generator having a variable output pulse width.

18. The register file circuit of claim 17, wherein the driver circuit outputs a pulse write signal coupled to the first header NFET gate, the second header NFET gate, and each of the plurality of header PFET gates.

19. The register file circuit of claim 18, wherein the driver circuit inputs a write clock signal and the pulse write signal is output before a write word line signal is active.

20. The register file circuit of claim 19, wherein the pulse write signal has a pulse width configured to provide a write completion time that allows the plurality of memory cells sufficient time to perform a write operation on the plurality of memory cell.

21. The register file circuit of claim 15, wherein each of the plurality of memory cells comprises:
a first PFET having a gate, a source and a drain, wherein the first PFET source is coupled to the virtual supply voltage;
a second PFET having a gate, a source, and a drain, wherein the second PFET source is coupled to the virtual supply voltage;
a first NFET having a gate, a source and a drain, wherein the first NFET source is coupled to the first PFET drain and the first NFET gate is coupled to the first PFET gate;
a second NFET having a gate, a source, and a drain, wherein the second NFET source is coupled to the second PFET drain and the second NFET gate is coupled to the second PFET gate;
a third NFET having a gate, a source, and a drain, wherein the third NFET gate is coupled to the write word line and the third NFET drain is coupled to the second PFET gate and the second NFET gate; and
a fourth NFET having a gate, a source, and a drain, wherein the fourth NFET gate is coupled to the write word line and the fourth NFET drain is coupled to the first PFET gate and the first NFET gate.

22. The register file circuit of claim 21, wherein each of the plurality of header pFETs is configured to turn ON when one of the plurality of first NFETs and one of the plurality of second NFETs in a same memory cell are OFF, and turn OFF, when the one of the plurality of first NFETs and the one of the plurality of second NFETs in the same memory cell are ON.

23. The register file circuit of claim 21, wherein each of the plurality of memory cells further comprises a first common node and a second common node, wherein the first common node comprises a true bitline and the second common node comprises a complementary bitline.

24. The register file circuit of claim 23, wherein each of the plurality of first common nodes and each of the plurality of second common nodes are driven to complementary logic voltages when performing a write operation on a respective one of the plurality of memory cells.

25. The register file circuit of claim 24, wherein the driver circuit outputs a pulse write signal and, when the pulse write signal is logic value HIGH, the plurality of first header PFETs turns OFF and causes one of the plurality of first PFETs and one of the plurality of second PFETs in a same memory cell to turn OFF.

26. The register file circuit of claim 15, wherein the plurality of memory cells are integrated into one of a mobile phone, a mobile communication device, a pager, a personal digital assistant, a personal information manager, a mobile handheld computer, a laptop computer, a wireless device, or a wireless modem.

27. A method of writing to a memory cell in a register file circuit, the method comprising the steps of:
receiving a write clock signal;
generating a pulse write signal;
applying the pulse write signal to a first header PFET to turn OFF the first header PFET and shut off a current path from a supply voltage to a memory cell;
applying the pulse write signal to a first header NFET and a second header NFET to turn ON the first header NFET and the second header NFET and clamp a virtual supply voltage to a threshold voltage configured to enable a write operation on the memory cell; and
applying a write bit signal to the memory cell to enable the write operation on the memory cell.

28. The method of claim 27, wherein applying the pulse write to the first header NFET and the second header NFET discharges the virtual supply voltage to reduce a write contention during the write operation.

29. The method of claim 28, wherein the pulse write signal is applied before the write bit signal is applied to the memory cell.

30. The method of claim 29, wherein generating the pulse write signal comprises generating the pulse write signal with a pulse width configured to allow completion of the write operation before the pulse write signal returns to zero.

* * * * *